(12) United States Patent
Suzuki

(10) Patent No.: US 11,942,712 B2
(45) Date of Patent: Mar. 26, 2024

(54) SUBSTRATE UNIT AND MANUFACTURING METHOD OF SUBSTRATE UNIT

(71) Applicant: YAZAKI CORPORATION, Tokyo (JP)

(72) Inventor: Masashi Suzuki, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 182 days.

(21) Appl. No.: 17/558,593

(22) Filed: Dec. 22, 2021

(65) Prior Publication Data
US 2022/0231438 A1    Jul. 21, 2022

(30) Foreign Application Priority Data

Jan. 15, 2021    (JP) .................................. 2021-004953

(51) Int. Cl.
  *H01R 12/52*    (2011.01)
  *H01R 12/71*    (2011.01)
  *H01R 43/20*    (2006.01)

(52) U.S. Cl.
  CPC ........... *H01R 12/716* (2013.01); *H01R 12/52* (2013.01); *H01R 43/205* (2013.01)

(58) Field of Classification Search
  CPC .... H01R 12/716; H01R 12/52; H01R 43/205; H01R 13/506; H05K 5/0069; H05K 7/026;
  (Continued)

(56) References Cited

U.S. PATENT DOCUMENTS 5,190,461 A * 3/1993 Oorui .................. H01R 24/50
                                                      439/74
5,772,452 A * 6/1998 Aoyama .............. H01R 12/716
                                                      439/74
(Continued)

FOREIGN PATENT DOCUMENTS

EP    0746063 A2    12/1996
EP    1180818 A2    2/2002
(Continued)

OTHER PUBLICATIONS

Adams G L: "Connectors for Use With Multiple PCBS", Motorola Technical Developments, Motorola Inc. Schaumburg, Illinois, US, vol. 11, Oct. 1, 1990 (Oct. 1, 1990), pp. 43-45.

*Primary Examiner* — Abdullah A Riyami
*Assistant Examiner* — Nelson R. Burgos-Guntin
(74) *Attorney, Agent, or Firm* — KENEALY VAIDYA LLP

(57) ABSTRACT

A substrate unit includes a first connector including a first terminal and a first housing accommodating the first terminal, and to be connected to an external connector, a first substrate on which the first connector is mounted, a second connector including a second terminal and a second housing accommodating the second terminal, and to be connected to the external connector, a second substrate on which the second connector is mounted and a case accommodating the first substrate and the second substrate. The first housing is provided with a first locking portion. The second housing is provided with a second locking portion. The first locking portion and the second locking portion are locked to each other. The first terminal and the second terminal are disposed to face an opening provided in the case through which the external connector is to be connected to the first connector and the second connector.

8 Claims, 7 Drawing Sheets

(58) Field of Classification Search
CPC .. H05K 5/0256; H05K 5/0026; H05K 7/1422; H05K 7/1435; H05K 7/1452; H05K 1/02; H05K 1/145; H05K 3/368; H05K 5/0217; H05K 7/1427
See application file for complete search history.

(56) References Cited

U.S. PATENT DOCUMENTS

| | | | | |
|---|---|---|---|---|
| 6,188,583 | B1* | 2/2001 | Fendt | H05K 7/142 361/752 |
| 6,477,593 | B1 | 11/2002 | Khosrowpour et al. | |
| 7,101,199 | B2* | 9/2006 | Yamashita | H05K 7/026 439/76.1 |
| 9,414,491 | B2* | 8/2016 | Kitajo | H01R 12/526 |
| 10,314,194 | B1 | 6/2019 | Chiang | |
| 2005/0233618 | A1 | 10/2005 | Yamashita | |
| 2010/0025126 | A1* | 2/2010 | Nakatsu | H05K 7/1432 361/699 |
| 2010/0238674 | A1* | 9/2010 | Kang | F21S 2/005 362/382 |
| 2014/0022737 | A1* | 1/2014 | Hsiao | H05K 7/08 361/729 |
| 2014/0285985 | A1 | 9/2014 | Tanaka et al. | |
| 2016/0088754 | A1* | 3/2016 | Francis | H05K 13/04 361/752 |
| 2016/0270261 | A1* | 9/2016 | Matsuda | G11B 33/1406 |
| 2016/0294111 | A1* | 10/2016 | Kobayashi | H01R 12/91 |
| 2016/0352215 | A1* | 12/2016 | Momose | H05K 7/1432 |
| 2017/0271794 | A1* | 9/2017 | Ooshiro | H01R 12/7047 |
| 2018/0027674 | A1* | 1/2018 | Sung | H01F 27/06 361/752 |
| 2019/0098777 | A1* | 3/2019 | Nakatsu | H01L 23/5385 |
| 2019/0182956 | A1* | 6/2019 | Kim | H05K 1/181 |
| 2021/0111501 | A1* | 4/2021 | Oda | H01R 13/05 |
| 2021/0212209 | A1* | 7/2021 | Kim | H05K 1/0215 |
| 2021/0234950 | A1* | 7/2021 | Hong | H01R 12/57 |
| 2021/0359481 | A1* | 11/2021 | Hänninen | H01R 43/24 |
| 2021/0384689 | A1* | 12/2021 | Riepl | H01R 12/73 |
| 2022/0231438 | A1* | 7/2022 | Suzuki | H01R 12/52 |
| 2022/0344243 | A1* | 10/2022 | Hur | G06F 1/20 |

FOREIGN PATENT DOCUMENTS

| | | |
|---|---|---|
| JP | H05-343125 A | 12/1993 |
| JP | 2004-55411 A | 2/2004 |
| JP | 2014-187123 A | 10/2014 |

* cited by examiner

SUBSTRATE UNIT AND MANUFACTURING METHOD OF SUBSTRATE UNIT

CROSS-REFERENCE TO RELATED APPLICATION

The present application claims priority to Japanese Patent Application No. 2021-004953 filed on Jan. 15, 2021, the entire content of which is incorporated herein by reference.

TECHNICAL FIELD

The presently disclosed subject matter relates to a substrate unit and a method of manufacturing the substrate unit.

BACKGROUND

In a substrate unit in the related art used for controlling an electrical device mounted on a vehicle, a substrate on which an input unit or an output unit, a control circuit, a connector for connection to the electrical device, and the like are mounted is generally accommodated in a case (for example, JP2014-187123A). The vehicle has various specifications, and the number of electrical devices to be mounted varies depending on the specifications. Therefore, it is necessary to design the substrate configuring the substrate unit for each specification.

In the related art, in order to eliminate a difference in the specification of the substrate, a substrate which includes input units or output units whose number meets a high-grade specification requirement is designed, and the substrate having the high-grade specification is mounted on a vehicle having a standard specification. However, in the vehicle having a standard specification, an unnecessary cost is generated due to an unused part of the substrate.

Therefore, in order to prevent such waste, providing a separate substrate is conceivable for difference in the specifications of the standard vehicle and a high-grade vehicle. More specifically, an input unit or an output unit to be connected to a standard electrical device mounted in common in both the standard specification and the high-grade specification is provided on a base substrate (a first substrate), and an input unit or an output unit to be connected to an extended electrical device mounted only in the high-grade specification is provided on an extended substrate (a second substrate). Then, the base substrate is mounted on the vehicle having a standard specification, and both the base substrate and the extended substrate are mounted on the vehicle having a high-grade specification.

In this case, there are two cases including a case where an extended connector to be connected to the extended electrical device is provided on the base substrate and a case where the extended connector is provided on the extended substrate. In the former case, there is a problem that the number of connections between the base substrate and the extended substrate increases. In the latter case, the number of connections between the base substrate and the extended substrate can be reduced, but there is a problem that a separate external connector needs to be connected to a connector provided on the base substrate and the extended connector mounted on the extended substrate, and the amount of work for coupling the connectors increases.

SUMMARY

Illustrative aspects of the presently disclosed subject matter provide a substrate unit and a method of manufacturing the substrate unit configured to reduce the amount of work for coupling a first connector mounted on a first substrate, a second connector mounted on a second substrate, and an external connector.

According to an illustrative aspect of the presently disclosed subject matter, a substrate unit includes a first connector including a first terminal and a first housing accommodating the first terminal, and configured to be connected to an external connector, a first substrate on which the first connector is mounted and a case accommodating the first substrate. The first housing is provided with a first locking portion configured to be locked to a second housing of a second connector mounted on a second substrate. The first terminal is disposed to face an opening provided in the case through which the external connector is to be connected to the first connector. According to another illustrative aspect of the presently disclosed subject matter, a substrate unit includes a first connector including a first terminal and a first housing accommodating the first terminal, and configured to be connected to an external connector, a first substrate on which the first connector is mounted, a second connector including a second terminal and a second housing accommodating the second terminal, and configured to be connected to the external connector, a second substrate on which the second connector is mounted and a case accommodating the first substrate and the second substrate. The first housing is provided with a first locking portion. The second housing is provided with a second locking portion. The first locking portion and the second locking portion are locked to each other. The first terminal and the second terminal are disposed to face an opening provided in the case through which the external connector is to be connected to the first connector and the second connector. According to yet another illustrative aspect of the presently disclosed subject matter, a manufacturing method for manufacturing a substrate unit, in which the substrate unit is either of a first substrate unit or a second substrate unit, includes preparing a first substrate on which a first connector is mounted, the first connector including a first terminal and a first housing accommodating the first terminal, the first housing being provided with a first locking portion, the first connector being configured to be connected to an external connector and a second substrate on which a second connector is mounted, the second connector including a second terminal and a second housing accommodating the second terminal, the second housing being provided with a second locking portion, the second connector being configured to be connected to the external connector and manufacturing the first substrate unit or the second substrate unit selectively according to which of a first specification or a second specification is selected. When the first specification is selected, the first substrate unit is to be manufactured and the manufacturing of the first substrate unit includes accommodating only the first substrate into the case such that the first terminal faces an opening provided in the case through which the external connector is to be connected to the first connector and when the second specification is selected, the second substrate unit is to be manufactured and the manufacturing of the second substrate unit includes locking the first locking portion and the second locking portion with each other and accommodating both the first substrate and the second substrate into the case such that the first terminal and the second terminal face the opening provided in the case through which the external connector is to be connected to the first connector and the second connector.

Other aspects and advantages of the presently disclosed subject matter will be apparent from the following description, the drawings and the claims.

DESCRIPTION OF EMBODIMENTS

A specific embodiment of the presently disclosed subject matter will be described below with reference to the drawings.

By a method of manufacturing a substrate unit according to the present embodiment, a substrate unit 1A (a second substrate unit) to be mounted on a vehicle having a high-grade specification (a second specification) and a substrate unit 1B (a first substrate unit) to be mounted on a vehicle having a standard specification (a first specification) are manufactured. First, the substrate unit 1A having a high-grade specification will be described with reference to FIGS. 1 to 5.

Figure 2:
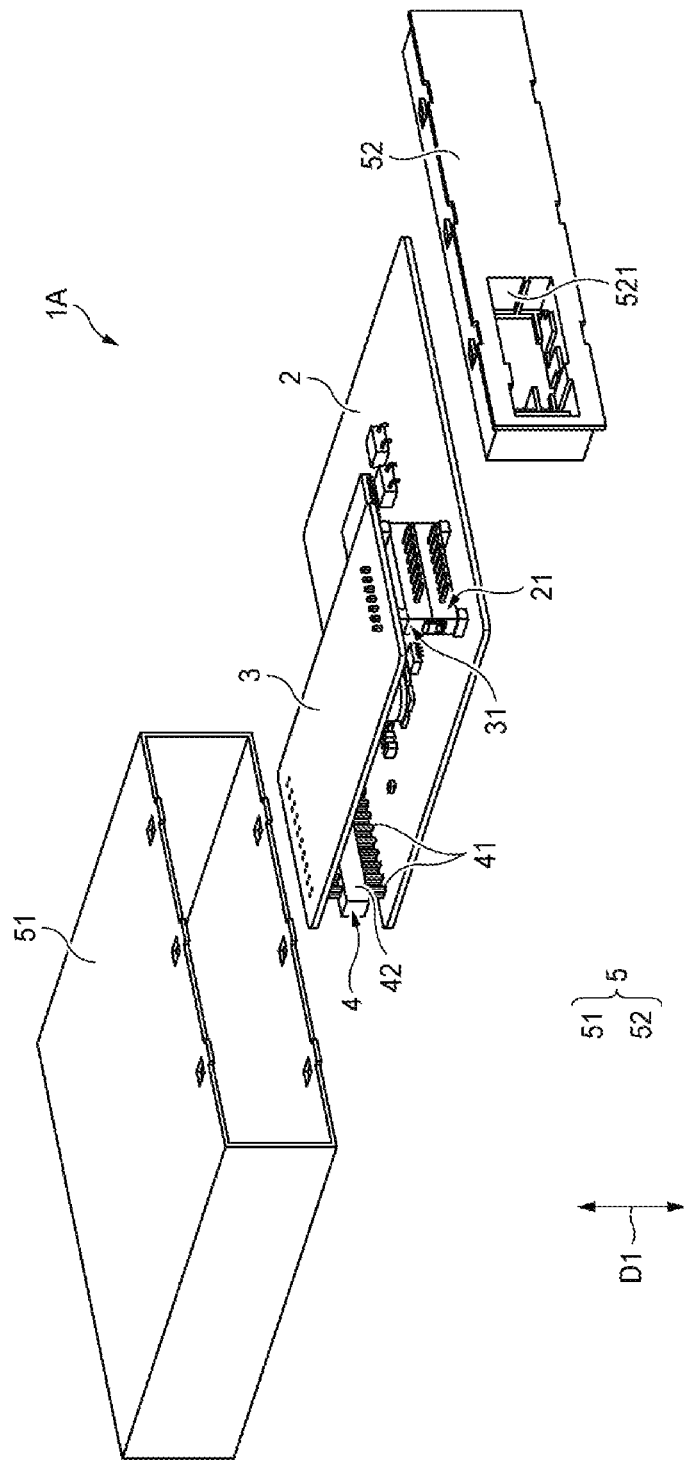
FIG. 2 is an exploded perspective view of the substrate unit having a high-grade specification shown in FIG. 1.

As shown in FIG. 2 and the like, the substrate unit 1A having a high-grade specification includes a base substrate 2 for operating a standard electrical device (not shown), an extended substrate 3 for operating an extended electrical device (not shown), a connecting unit 4 for electrically connecting the base substrate 2 and the extended substrate 3, and a case 5 for accommodating the base substrate 2 and the extended substrate 3. The standard electrical device is an electrical device (for example, an air conditioner unit, a power window unit, or the like) that is attached in common to a vehicle having a high-grade specification and a vehicle having a standard specification. The extended electrical device is an electrical device that is selectively attached according to a specification of a vehicle.

Figure 3:
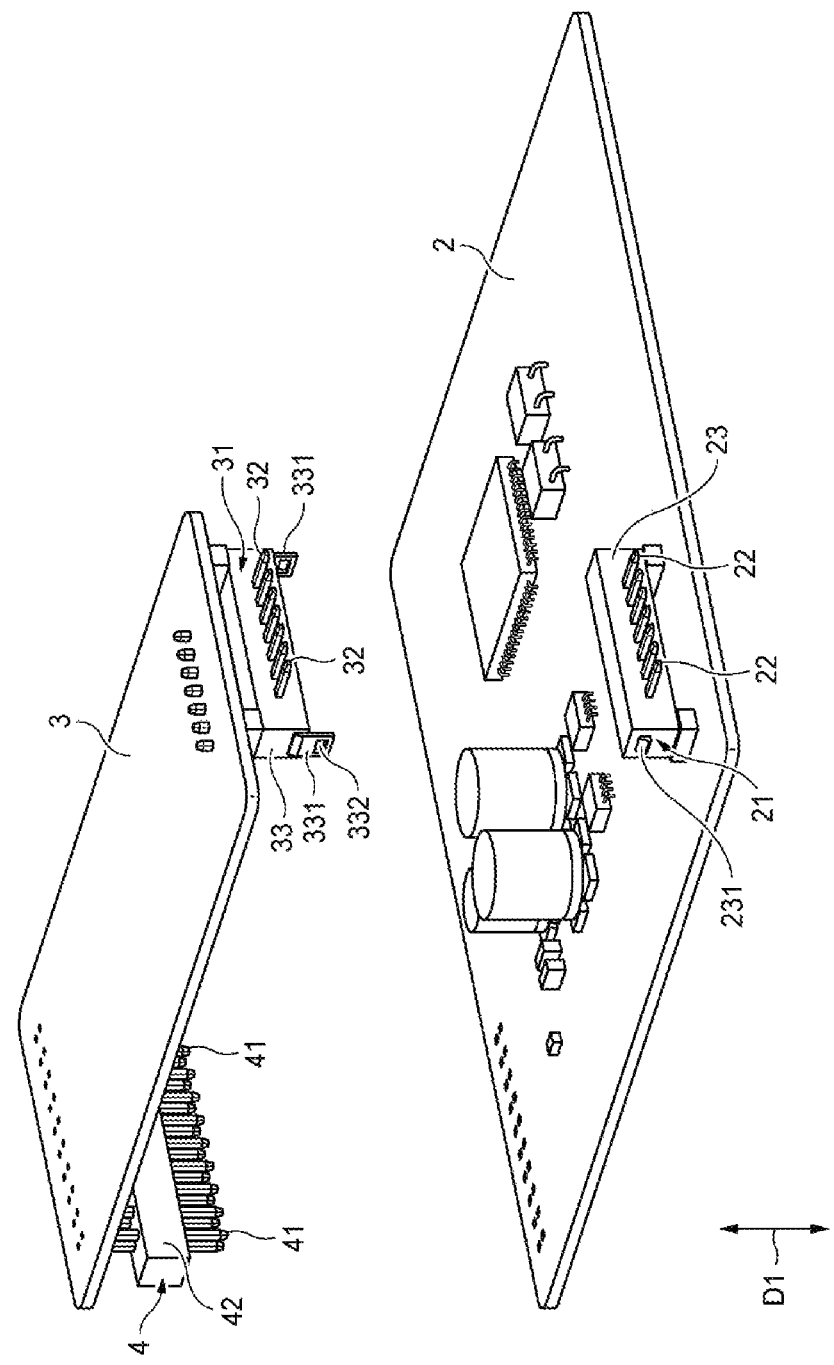
FIG. 3 is an enlarged exploded perspective view of a base substrate and an extended substrate shown in FIG. 2.
Figure 4:
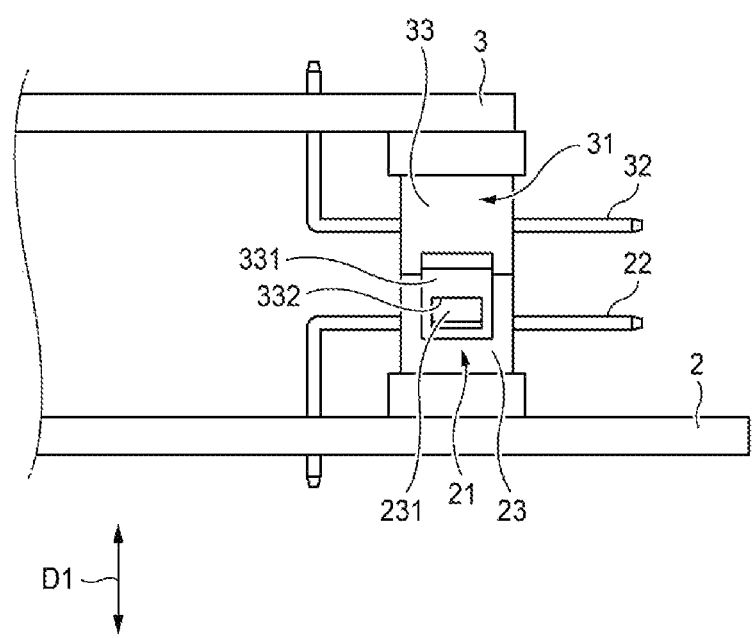
FIG. 4 is a partial side view of the base substrate and the extended substrate shown in FIG. 2.

As shown in FIGS. 2 to 4, a connector (a first connector) 21 and the like are mounted on the base substrate 2. As shown in FIGS. 3 and 4, the connector 21 includes terminals (first terminals) 22 and a housing (first housing) 23 that accommodates the terminals. In the present embodiment, as shown in FIG. 4 and the like, the terminal 22 is formed in a substantially L shape, one end thereof extending along a thickness direction D1 of the base substrate 2 is connected to the base substrate 2, and the other end thereof extending parallel to the base substrate 2 is accommodated in the housing 23. The other end of the terminal 22 is configured as, for example, a male terminal, and protrudes from the housing 23.

The housing 23 is provided with locking projections 231 to be locked to a housing 33 of an extended connector 31 to be described later. The locking projections 231 (first locking portions) are provided on outer surfaces of the housing 23 facing in a direction orthogonal to both the thickness direction D1 and a direction along which the other end of the terminal 22 extends. The connector 21 is to be connected to an external connector (not shown) provided at an end of a wire harness. The wire harness is connected to a central ECU (host control device), a standard electrical device, and an extended electrical device (not shown).

Figure 5:
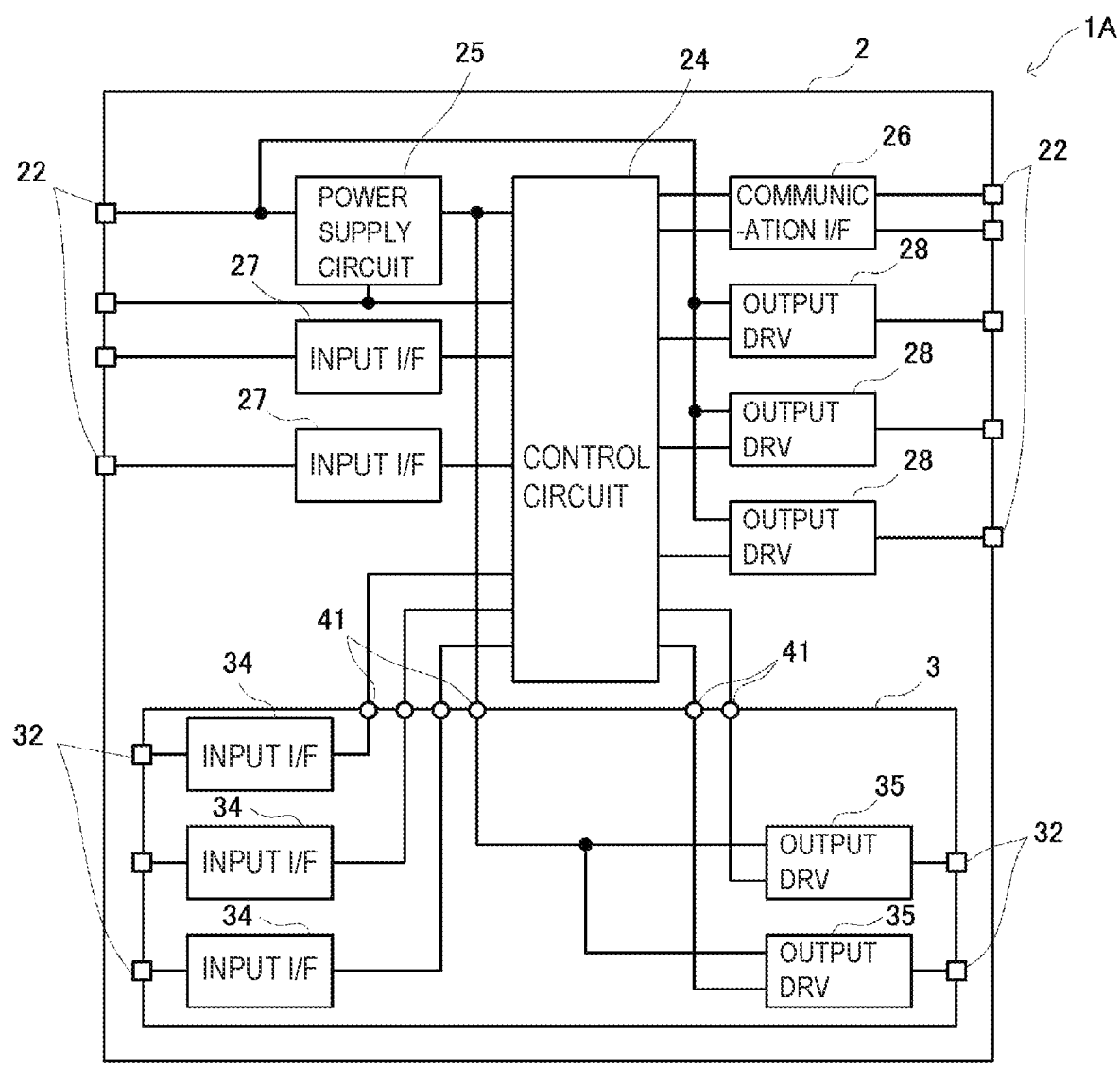
FIG. 5 is an electrical configuration diagram of the substrate unit having a high-grade specification shown in FIG. 1.

As shown in FIG. 5, a control circuit 24, a power supply circuit 25, a communication interface (I/F) 26, and the like are mounted on the base substrate 2. The control circuit 24 includes, for example, a microcomputer having a CPU. The control circuit 24 communicates with the central ECU and controls the standard electrical device and the extended electrical device according to instructions from the central ECU. The power supply circuit 25 generates power for the control circuit 24 from power supplied via an external connector. The communication I/F 26 is a circuit that modulates and demodulates communication signals transmitted and received between the central ECU and the control circuit 24.

Various circuits are mounted on the base substrate 2 according to a type of the standard electrical device, and the various circuits are connected to the control circuit 24. In the example shown in FIG. 5, two input I/Fs 27 (input units) and three output drives (DRVs) 28 (output units) are mounted on the base substrate 2. For example, when the standard electrical device is a device, that inputs ON/OFF information or the like to the control circuit 24, such as a detection switch, the input I/F 27 is mounted with respect to the standard electrical device. Further, when the standard electrical device is a device, that operates based on an output from the control circuit 24, such as a motor or a lamp, the output DRV 28 is mounted with respect to the standard electrical device. The power supply circuit 25, the communication I/F 26, the input I/Fs 27, and the output DRVs 28 are connected to the terminals 22, and when an external connector is connected to the terminals 22, the power supply circuit 25, the communication I/F 26, the input I/Fs 27, and the output DRVs 28 are connected to the central ECU and/or the standard electrical device.

As shown in FIGS. 2 to 4, the base substrate 2 and the extended substrate 3 are stacked along the thickness direction D1. An extended connector (a second connector) 31 and the like are mounted on the extended substrate 3. The extended connector 31 includes terminals (second terminals) 32 and a housing (a second housing) 33 that accommodates the terminals 32. In the present embodiment, as shown in FIG. 4, the terminal 32 is formed in a substantially L shape, one end thereof extending along the thickness direction D1 is connected to the extended substrate 3, and the other end thereof extending parallel to the extended substrate 3 is accommodated in the housing 33. The other end of the terminal 32 is configured as, for example, a male terminal, and protrudes from the housing 33.

The housing 33 is provided with locking portions 331 (second locking portions) to be locked to the housing 23 of the connector 21. The locking portions 331 are provided to protrude toward the connector 21 and extend from outer surfaces of the housing 33 facing in a direction orthogonal to both the thickness direction D1 and the other end of the terminal 32. Further, the locking portion 331 is provided with a locking hole 332 into which the locking projection 231 is to be inserted. When the base substrate 2 and the extended substrate 3 are stacked along the thickness direction D1 and the housing 23 and the housing 33 are disposed adjacently with each other along the thickness direction D1, the locking projections 231 are inserted into the locking holes 332, and the housing 23 and the housing 33 get locked. Therefore, the housing 23 and the housing 33 can be integrated with each other, and the connector 21 and the extended connector 31 can together form one connector configured to be connected to an external connector.

Further, as shown in FIG. 5, various circuits are mounted on the extended substrate 3 according to a type of the extended electrical device, similarly to the base substrate 2. In the example shown in FIG. 5, three input I/Fs 34 (extended input units) and two output DRVs 35 (extended output units) are mounted. The input I/Fs 34 and the output DRVs 35 are connected to the terminals 32, and when an external connector is connected to the terminals 32, the input I/Fs 34 and the output DRVs 35 are connected to the extended electrical device.

In the present embodiment, as shown in FIGS. 2 and 3, a pin header including a plurality of terminals 41 extending orthogonal to the base substrate 2 and the extended substrate 3 and a resin holder 42 for holding the plurality of terminals 41 is used as the connecting unit 4. Both ends of each of the terminals 41 protrude from the holder 42. One end of each of the terminals 41 is connected to the base substrate 2, and the other end of each of the terminals 41 is connected to the extended substrate 3. As shown in FIG. 5, the input I/Fs 34 and the output DRVs 35 are connected to the control circuit 24 via the terminals 41 of the connecting unit 4.

Figure 1:
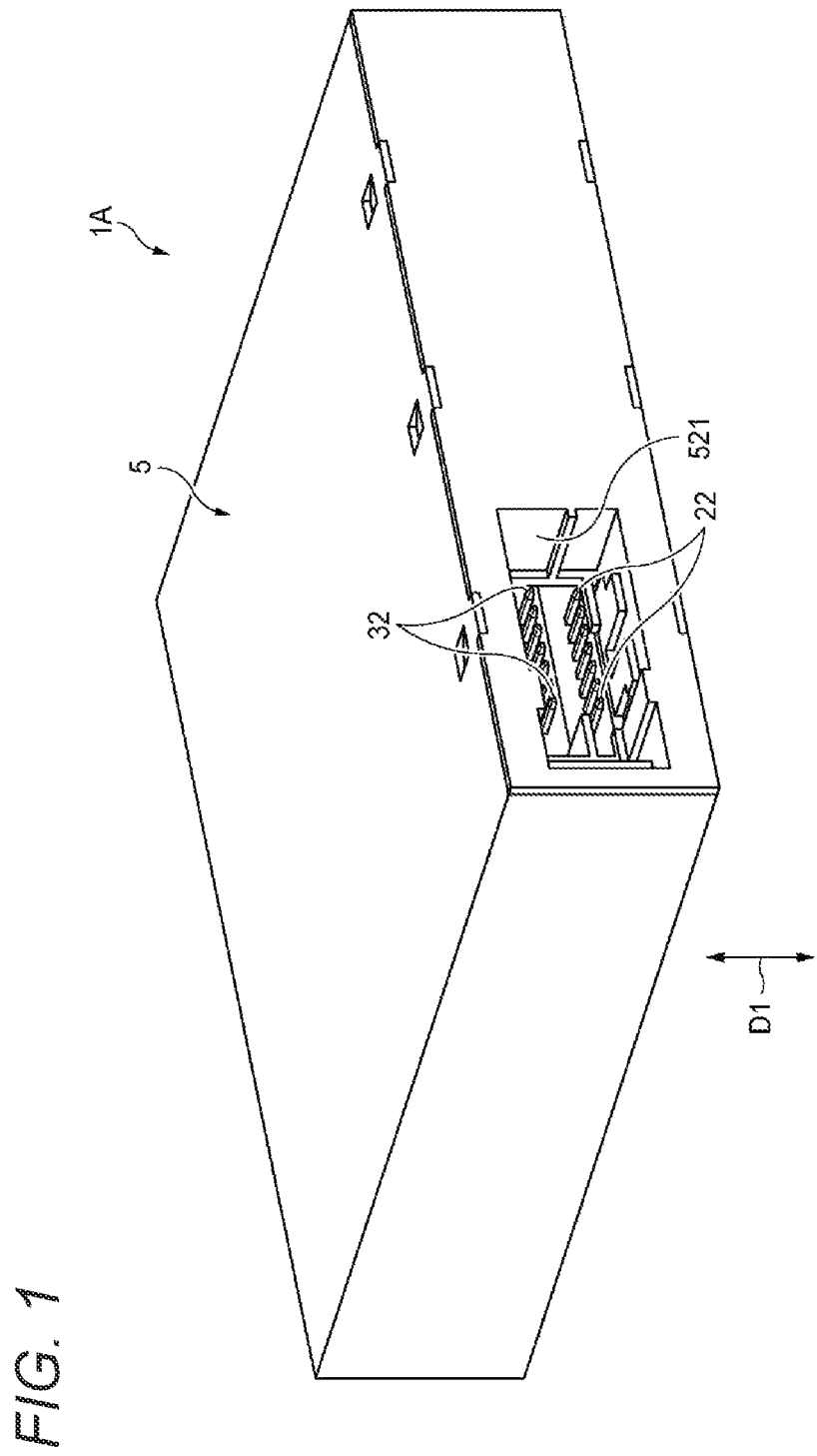
FIG. 1 is a perspective view of a substrate unit having a high-grade specification according to the presently disclosed subject matter.

As shown in FIG. 2, the case 5 includes a box-shaped case main body 51 that is opened toward a front side, and a front cover 52 configured to close the front opening of the case main body 51. The front cover 52 is provided with one opening 521 through which an external connector is to be fitted. The base substrate 2 and the extended substrate 3 are accommodated into the case main body 51 from the front opening of the case main body 51. Thereafter, when the front opening of the case main body 51 is closed by the front cover 52, as shown in FIG. 1, the terminals 22 and the terminals 32 are disposed to face the opening 521 and are exposed from the one opening 521. Therefore, the external connector can be inserted through the opening 521 and connected to the connectors 21 and the connectors 31.

Figure 6:
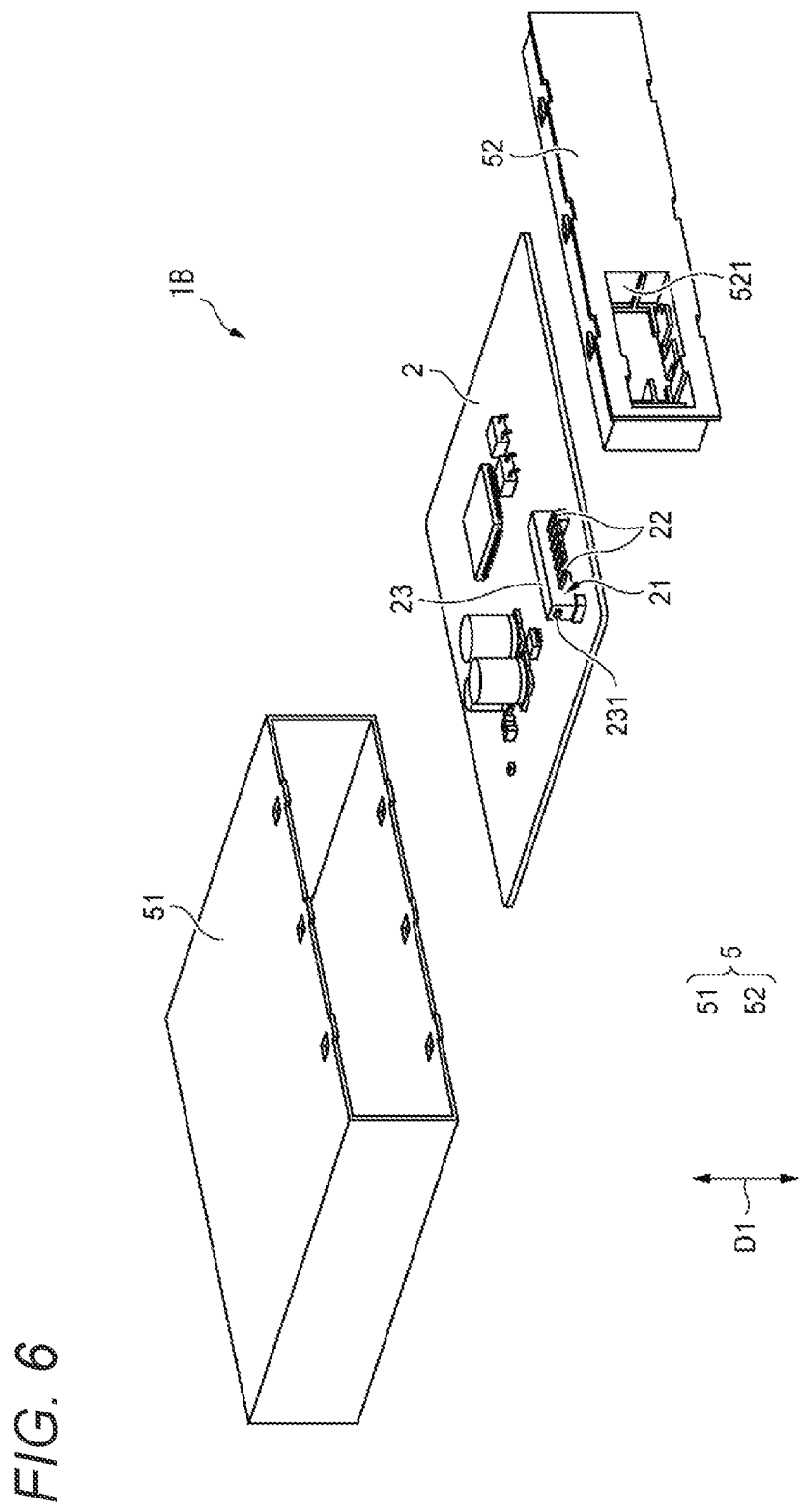
FIG. 6 is an exploded perspective view of a substrate unit having a standard specification according to the presently disclosed subject matter.
Figure 7:
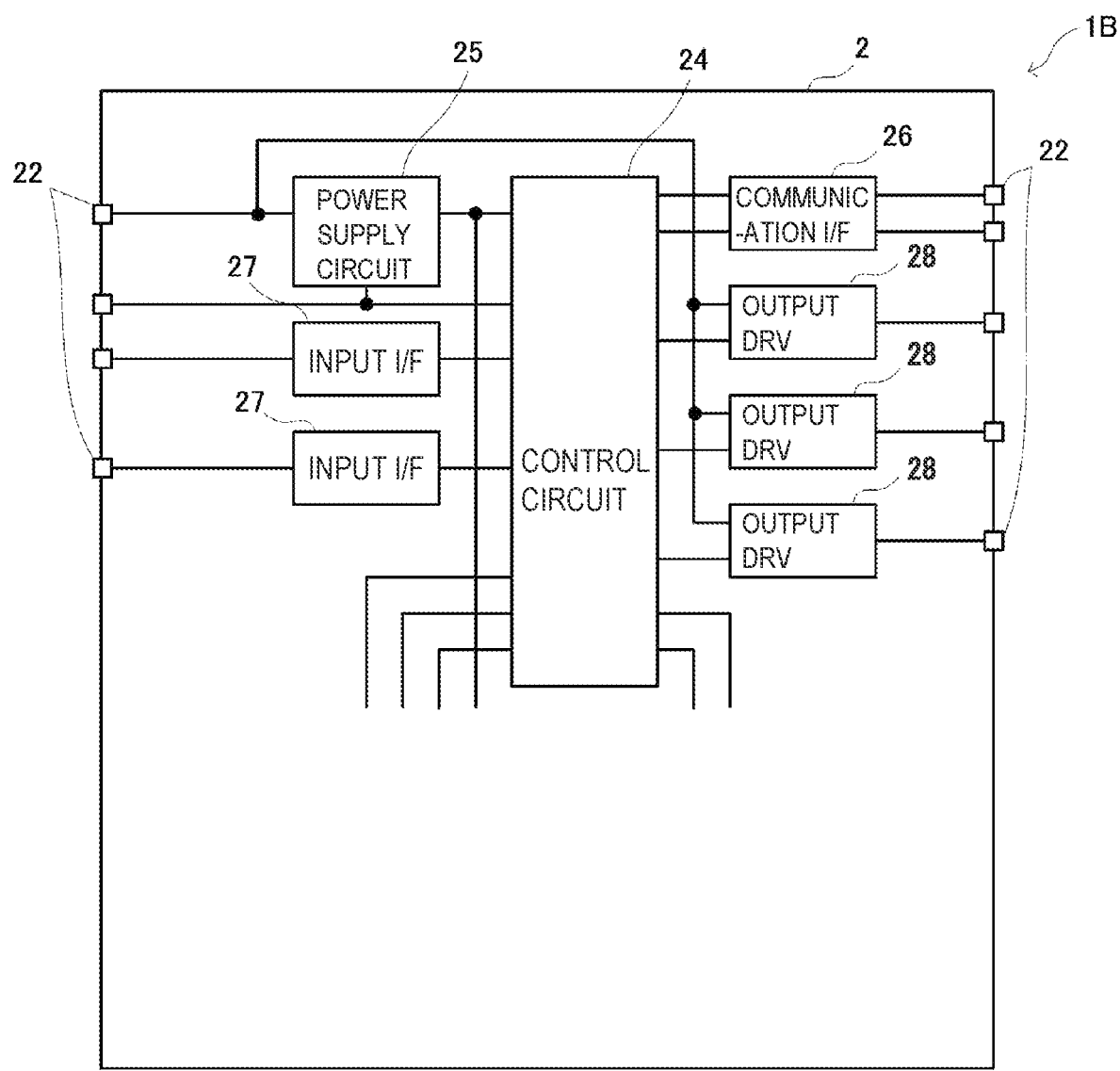
FIG. 7 is an electrical configuration diagram of the substrate unit having a standard specification shown in FIG. 6.

Next, the substrate unit 1B having a standard specification will be described with reference to FIGS. 6 and 7. As shown in FIGS. 6 and 7, the substrate unit 1B having a standard specification includes the base substrate 2 for operating a standard electrical device and a case 5 for accommodating the base substrate 2, and does not include the extended substrate 3 and the connecting unit 4. The base substrate 2 and the case 5 are the same as the base substrate 2 and the case 5 provided in the substrate unit 1A. When the base substrate 2 is accommodated in the case 5, the terminals 22 are disposed to face the opening 521 and are exposed from the opening 521.

Next, a method of manufacturing the substrate units 1A and 1B will be described. First, the base substrate 2 on which the connector 21 is mounted and the extended substrate 3 on which the extended connector 31 is mounted are prepared. As the extended substrate 3, a plurality of types of substrates having different numbers of input I/Fs 34 and output DRVs 35 may be prepared. In a case of a high-grade specification (a second specification), the extended substrate 3 corresponding to the specification is selected. Next, the base substrate 2 and the extended substrate 3 are stacked, and the housing 23 and the housing 33 are locked. Further, the base substrate 2 and the extended substrate 3 are connected to each other by using the connecting unit 4. Thereafter, the base substrate 2 and the extended substrate 3 are accommodated in the case 5 such that the terminals 22 and the terminals 32 face the opening 521 provided in the case 5, and the substrate unit 1A is manufactured.

According to the substrate unit 1A having a high-grade specification, the connector 21 and the extended connector 31 are mounted on the base substrate 2 and the extended substrate 3, respectively. Therefore, the input I/Fs 34 and the output DRVs 35 mounted on the extended substrate 3 do not have to be connected to the terminals 22 of the connector 21 mounted on the base substrate 2, so that the number of connections between the base substrate 2 and the extended substrate 3 can be reduced.

Further, the housing 23 of the connector 21 mounted on the base substrate 2 and the housing 33 of the extended connector 31 mounted on the extended substrate 3 are locked to each other. The terminals 22 and the terminals 32 are disposed to face the opening 521 provided in the case 5. Therefore, the connector 21 and the extended connector 31 can be coupled as one connector configured to be connected to an external connector, and the work of coupling the connector 21 and the extended connector 31 respectively provided on the base substrate 2 and the extended substrate 3 to the external connector can be reduced.

According to the substrate unit 1A, the base substrate 2 and the extended substrate 3 are stacked in the thickness direction D1, and the housing 23 and the housing 33 are disposed adjacently with each other in the thickness direction D1. Therefore, space saving can be achieved.

In a case of a standard specification (a first specification), the substrate unit 1B is manufactured by accommodating only the base substrate 2 in the case 5 such that the terminals 22 face the opening 521 provided in the case 5. According to the substrate unit 1B having a standard specification, the input I/Fs 34 and the output DRVs 35 that do not need to be used are not mounted on a vehicle having a standard specification. When the substrate is desired to be extended, the housing 33 of the extended connector 31 mounted on the extended substrate 3 can be locked to the locking projections 231 of the connector 21.

While the presently disclosed subject matter has been described with reference to certain exemplary embodiments thereof, the scope of the presently disclosed subject matter is not limited to the exemplary embodiments described above, and it will be understood by those skilled in the art that various changes and modifications may be made therein without departing from the scope of the presently disclosed subject matter as defined by the appended claims.

According to the above-described embodiment, the base substrate 2 and the extended substrate 3 are stacked along the thickness direction D1, but the presently disclosed subject matter is not limited thereto. The base substrate 2 and the extended substrate 3 may be disposed adjacently with each other along a width direction or a length direction of the base substrate 2.

According to the above-described embodiment, the base substrate 2 and the extended substrate 3 are electrically connected by the connecting unit 4, but the presently disclosed subject matter is not limited thereto. If the extended substrate 3 is provided with a control circuit, the base substrate 2 and the extended substrate 3 may not be electrically connected to each other.

Further, according to the above-described embodiment, the case 5 is used for both the standard specification and the high-grade specification, but the presently disclosed subject matter is not limited thereto. A case 5 having a small opening 521 may be used for the standard specification, and a case 5 having a large opening 521 may be used for the high-grade specification.

According to an aspect of the embodiments described above, a substrate unit (1A) includes a first connector (21) including a first terminal (22) and a first housing (23) accommodating the first terminal (22), and configured to be connected to an external connector, a first substrate (2) on which the first connector (21) is mounted, a second connector (31) including a second terminal (32) and a second housing (33) accommodating the second terminal (32), and configured to be connected to the external connector, a second substrate (3) on which the second connector (31) is mounted and a case (5) accommodating the first substrate (2) and the second substrate (3). The first housing (23) is provided with a first locking portion (231). The second housing (33) is provided with a second locking portion (331). The first locking portion (231) and the second locking portion (331) are locked to each other. The first terminal (22) and the second terminal (32) are disposed to face an opening (521) provided in the case (5) through which the external connector is to be connected to the first connector (21) and the second connector (31).

According to the substrate unit having the above configuration, the first locking portion of the first housing and the second locking portion of the second housing are locked to each other, and the first terminal and the second terminal are disposed to face the opening provided in the case for fitting the external connector. Therefore, the first connector and the second connector can be coupled as one connector to be connected to the external connector, and the work of coupling the first connector mounted on the first substrate, the second connector mounted on the second substrate, and the external connector can be reduced.

The first substrate (2) and the second substrate (3) may be stacked on each other along a thickness direction (D1) of the substrate unit (1A), and the first housing (23) and the second housing (33) may be disposed adjacently with each other along the thickness direction (D1).

With this configuration, since the first substrate and the second substrate can be stacked on each other in the thickness direction and accommodated in the case, space saving can be achieved.

The substrate unit (1A) may further include a connecting unit (4) configured to connect the first substrate (2) and the second substrate (3) to each other. The first substrate (2) may include a control circuit (24) and an input unit (27) or an output unit (28) connected to the control circuit (24). The first terminal (22) may be connected to the input unit (27) or the output unit (28). The second substrate (3) may include an extended input unit (34) or an extended output unit (35). The second terminal (32) may be connected to the extended input unit (34) or the extended output unit (35). The control circuit (24) may be connected to the extended input unit (34) or the extended output unit (35) via the connecting unit (4).

With this configuration, by connecting the first substrate and the second substrate, the extended input unit or the extended output unit can be connected to the control circuit. Thus, the input unit or the output unit can be extended.

According to another aspect of the embodiments described above, a substrate unit (1B) includes a first connector (21) including a first terminal (22) and a first housing (23) accommodating the first terminal (22), and configured to be connected to an external connector, a first substrate (2) on which the first connector (21) is mounted and a case (5) accommodating the first substrate (2). The first housing (23) is provided with a first locking portion (231) configured to be locked to a second housing (33) of a second connector (31) mounted on a second substrate (3). The first terminal (22) is disposed to face an opening (521) provided in the case (5) through which the external connector is to be connected to the first connector (21).

According to the substrate unit having the above configuration, when it is desired to extend the substrate, the second housing of the second connector mounted on the second substrate can be locked to the first locking portion of the first connector. Therefore, the first connector and the second connector can be coupled as one connector to be connected to the external connector, and the work of coupling the first connector provided on the first substrate, the second connector provided on the second substrate, and the external connector can be reduced.

According to yet another aspect of the embodiments described above, a manufacturing method for manufacturing a substrate unit (1A, 1B), in which the substrate unit (1A, 1B) is either of a first substrate unit (1B) or a second substrate unit (1A), includes preparing a first substrate (2) on which a first connector (21) is mounted, the first connector (21) including a first terminal (22) and a first housing (23) accommodating the first terminal (22), the first housing (23) being provided with a first locking portion (231), the first connector (21) being configured to be connected to an external connector and a second substrate (3) on which a second connector (31) is mounted, the second connector (31) including a second terminal (32) and a second housing (33) accommodating the second terminal (32), the second housing (33) being provided with a second locking portion (331), the second connector (31) being configured to be connected to the external connector and manufacturing the first substrate unit (1B) or the second substrate unit (1A) selectively according to which of a first specification or a second specification is selected. When the first specification is selected, the first substrate unit (1B) is to be manufactured and the manufacturing of the first substrate unit (1B) includes accommodating only the first substrate (2) into the case (5) such that the first terminal (22) faces an opening (521) provided in the case (5) through which the external connector is to be connected to the first connector (21) and when the second specification is selected, the second substrate unit (1A) is to be manufactured and the manufacturing of the second substrate unit (1A) includes locking the first locking portion (231) and the second locking portion (331) with each other and accommodating both the first substrate (2) and the second substrate (3) into the case (5) such that the first terminal (22) and the second terminal (32) face the opening (521) provided in the case (5) through which the external connector is to be connected to the first connector (21) and the second connector (31).

According to the method of manufacturing a substrate unit having the above configuration, in a case of a first specification, only the first substrate is accommodated in the case, and a substrate that is not used does not have to be accommodated in the case. In a case of a second specification, both the first substrate and the second substrate are accommodated in the case. At this time, the first housing of the first connector mounted on the first substrate and the second housing of the second connector mounted on the second substrate are locked to each other, and the first terminal and the second terminal are disposed to face the opening of the case. Therefore, the first connector and the second connector can be coupled as one connector which is to be connected to the external connector, and the work of coupling the first connector provided on the first substrate, the second connector provided on the second substrate, and the external connector can be reduced.

What is claimed is:

1. A substrate unit comprising:
a first connector including a first terminal and a first housing accommodating the first terminal, and configured to be connected to an external connector;
a first substrate on which the first connector is mounted;
a second connector including a second terminal and a second housing accommodating the second terminal, and configured to be connected to the external connector;
a second substrate on which the second connector is mounted; and
a case accommodating the first substrate and the second substrate,
wherein the first housing is provided with a first locking portion,
wherein the second housing is provided with a second locking portion,
wherein, when a first specification is selected, only the first substrate is accommodated into the case such that the first terminal faces an opening provided in the case through which the external connector is to be connected to the first connector,
wherein, when a second specification is selected, the first locking portion and the second locking portion are locked to each other, and both the first substrate and the second substrate are accommodated into the case such that the first terminal and the second terminal are disposed to face the opening provided in the case through which the external connector is to be connected to the first connector and the second connector.

2. The substrate unit according to claim 1,
wherein the first substrate and the second substrate are stacked on each other along a thickness direction of the substrate unit, and
wherein the first housing and the second housing are disposed adjacently with each other along the thickness direction.

3. The substrate unit according to claim 1 further including:
a connecting unit configured to connect the first substrate and the second substrate to each other,
wherein the first substrate includes a control circuit and an input unit or an output unit connected to the control circuit,
wherein the first terminal is connected to the input unit or the output unit,
wherein the second substrate includes an extended input unit or an extended output unit,
wherein the second terminal is connected to the extended input unit or the extended output unit, and
wherein the control circuit is connected to the extended input unit or the extended output unit via the connecting unit.

4. A substrate unit comprising:
a first connector including a first terminal and a first housing accommodating the first terminal, and configured to be connected to an external connector;
a first substrate on which the first connector is mounted; and
a case accommodating the first substrate,
wherein the first housing is provided with a first locking portion configured to be locked to a second housing of a second connector mounted on a second substrate,
wherein the first terminal includes one end connected to the first substrate and another end that extends away from the first housing in a direction that is parallel to the first substrate, and
wherein the another end of the first terminal is disposed to face an opening provided in the case through which the external connector is to be connected to the first connector.

5. A manufacturing method for manufacturing a substrate unit, wherein the substrate unit is either of a first substrate unit or a second substrate unit, the method including:
preparing a first substrate on which a first connector is mounted, the first connector including a first terminal and a first housing accommodating the first terminal, the first housing being provided with a first locking portion, the first connector being configured to be connected to an external connector, and
a second substrate on which a second connector is mounted, the second connector including a second terminal and a second housing accommodating the second terminal, the second housing being provided with a second locking portion, the second connector being configured to be connected to the external connector; and
manufacturing the first substrate unit or the second substrate unit selectively according to which of a first specification or a second specification is selected,
wherein, when the first specification is selected, the first substrate unit is to be manufactured and the manufacturing of the first substrate unit includes: accommodating only the first substrate into the case such that the first terminal faces an opening provided in the case through which the external connector is to be connected to the first connector; and
wherein, when the second specification is selected, the second substrate unit is to be manufactured and the manufacturing of the second substrate unit includes: locking the first locking portion and the second locking portion with each other and accommodating both the first substrate and the second substrate into the case such that the first terminal and the second terminal face the opening provided in the case through which the external connector is to be connected to the first connector and the second connector.

6. The substrate unit according to claim 1,
wherein the first terminal includes one end connected to the first substrate and another end that extends away from the first housing in a direction that is parallel to the first substrate.

7. The substrate unit according to claim 6,
wherein the second terminal includes one end connected to the second substrate and another end that extends away from the second housing in a direction that is parallel to the second substrate.

8. The substrate unit according to claim 7,
wherein the first locking portion is a projection that protrudes from a side of the first housing, and
wherein the second locking portion protrudes away from the second housing in a direction that is toward the first housing, and the second locking portion includes a locking hole into which the locking protrusion extends.

* * * * *